United States Patent
An et al.

(10) Patent No.: US 9,858,916 B2
(45) Date of Patent: Jan. 2, 2018

(54) SOUND PROCESSING METHOD AND TERMINAL DEVICE

(71) Applicant: HUAWEI DEVICE (DONGGUAN) CO., LTD., Dongguan (CN)

(72) Inventors: Kang An, Shenzhen (CN); Cunshou Qiu, Shanghai (CN); Qing Chang, Shanghai (CN)

(73) Assignee: HUAWEI DEVICE (DONGGUAN) CO., LTD., Dongguan (CN)

( * ) Notice: Subject to any disclaimer, the term of this patent is extended or adjusted under 35 U.S.C. 154(b) by 0 days.

(21) Appl. No.: 14/980,421

(22) Filed: Dec. 28, 2015

(65) Prior Publication Data
US 2016/0133245 A1    May 12, 2016

Related U.S. Application Data

(63) Continuation of application No. PCT/CN2014/090210, filed on Nov. 4, 2014.

(30) Foreign Application Priority Data

Nov. 7, 2013 (CN) .......................... 2013 1 0552516

(51) Int. Cl.
*H03G 3/00* (2006.01)
*G10K 15/08* (2006.01)
(Continued)

(52) U.S. Cl.
CPC ............. *G10K 15/08* (2013.01); *G10H 1/366* (2013.01); *G10L 21/02* (2013.01); *G10H 1/361* (2013.01);
(Continued)

(58) Field of Classification Search
CPC .......... H03G 3/00; H04R 3/002; H04R 3/005; H03M 1/12; H03M 1/66; G10H 1/361;
(Continued)

(56) References Cited

U.S. PATENT DOCUMENTS

2005/0182504 A1    8/2005    Bailey
2008/0091420 A1    4/2008    Chuang
(Continued)

FOREIGN PATENT DOCUMENTS

CN    101162894 A    4/2008
CN    101166317 A    4/2008
(Continued)

OTHER PUBLICATIONS

Digidesign by Avid, Pro Tools Reference Guide, 2010, version 9.0, all.*
(Continued)

*Primary Examiner* — Xu Mei
*Assistant Examiner* — Ubachukwu Odunukwe
(74) *Attorney, Agent, or Firm* — Conley Rose, P.C.

(57) ABSTRACT

A method comprising acquiring an analog first sound signal, performing analog-to-digital conversion on the first sound signal to generate a digital second sound signal, performing reverberation processing, at a system bottom layer, on the second sound signal to generate a digital third sound signal, performing digital sound mixing processing on the third sound signal and a background sound signal sent from an application layer to generate a digital fourth sound signal, performing digital-to-analog conversion on the fourth sound signal to generate an analog fifth sound signal, performing analog sound mixing processing on the first sound signal and the fifth sound signal to generate an analog sixth sound signal, and playing the sixth sound signal.

20 Claims, 5 Drawing Sheets

(51) Int. Cl.
| | |
|---|---|
| *G10L 21/02* | (2013.01) |
| *H04R 3/00* | (2006.01) |
| *G10H 1/36* | (2006.01) |
| *H03M 1/12* | (2006.01) |
| *H03M 1/66* | (2006.01) |

(52) U.S. Cl.
CPC .. *G10H 2210/281* (2013.01); *G10H 2230/015* (2013.01); *G10H 2250/061* (2013.01); *H03M 1/12* (2013.01); *H03M 1/66* (2013.01); *H04R 3/002* (2013.01); *H04R 3/005* (2013.01)

(58) Field of Classification Search
CPC ............. G10H 1/366; G10H 2210/281; G10H 2230/015; G10H 2250/061; G10K 15/08; G10L 21/02
USPC .................... 381/63, 61; 704/500; 700/94
See application file for complete search history.

(56) References Cited

U.S. PATENT DOCUMENTS

| | | | |
|---|---|---|---|
| 2009/0204413 A1* | 8/2009 | Sintes ................ | G10L 19/16 704/500 |
| 2010/0263519 A1 | 10/2010 | Lu et al. | |
| 2014/0105411 A1* | 4/2014 | Santos .................. | G10H 1/361 381/66 |

FOREIGN PATENT DOCUMENTS

| | | |
|---|---|---|
| CN | 101609667 A | 12/2009 |
| CN | 101630507 A | 1/2010 |
| CN | 201378076 Y | 1/2010 |
| CN | 101867691 A | 10/2010 |
| CN | 102710857 A | 10/2012 |
| JP | 2000330578 A | 11/2000 |

OTHER PUBLICATIONS

Digidesign by Avid, Mbox 2 Basics Guise, 2005, version 7.0, all.*
Behringer, Minimix mix800 user manual, 2011, all.*
Graham, "How to Record Zero Latency Vocals with Reverb," Recording Revolution, Retrieved from the Internet: URL: http://web.archive.org/web/20130509223215/http://therecordingrevolution.com/2012/09/24/how-to-record-zero-latency-vocals-with-reverb/ [retrieved on Sep. 5, 2016], May 9, 2013, 8 pages.
Morse, P., et al., "Absolute Beginners' Guide to DJ Effects," Retrieved from the Internet: URL:https://web.archive.org/web/20130620174100/http://www.digitaldjtips.com/2011/03/beginners-guide-to-dj-effects/[retrieved on Sep. 6, 2016] Jun. 20, 2013, 28 pages.
"Sound Card—Wikipedia," Retrieved from the Internet: URL:https://web.archive.org/web/20101112162254/http://en.wikipedia.org/wiki/Sound_card [retrieved on Sep. 6, 2016], Nov. 12, 2010, 8 pages.
Foreign Communication From A Counterpart Application, European Application No. 14859910.3, Extended European Search Report dated Oct. 7, 2016, 11 pages.
Partial English Translation and Abstract of Chinese Patent Application No. CN101166317, Dec. 18, 2015, 4 pages.
Partial English Translation and Abstract of Chinese Patent Application No. CN201378076, Part 1, Dec. 18, 2015, 3 pages.
Partial English Translation and Abstract of Chinese Patent Application No. CN201378076, Part 2, Dec. 18, 2015, 2 pages.
Foreign Communication From A Counterpart Application, PCT Application No. PCT/CN2014/090210, English Translation of International Search Report dated Feb. 17, 2015, 3 pages.
Foreign Communication From A Counterpart Application, PCT Application No. PCT/CN2014/090210, Written Opinion dated Feb. 17, 2015, 5 pages.
Lee, J., "PC and Digital Audio," Introduction of Digital Audio 14, Monthly Audio, Aug. 1, 2012, 6 pages.
English Translation of Lee, J., "PC and Digital Audio," Introduction of Digital Audio 14, Monthly Audio, Aug. 1, 2012, 6 pages.
Foreign Communication From A Counterpart Application, Korean Application No. 10-2016-7000367, Korean Office Action dated Jan. 19, 2017, 5 pages.
Foreign Communication From A Counterpart Application, Korean Application No. 10-2016-7000367, English Translation of Korean Office Action dated Feb. 2, 2017, 7 pages.

* cited by examiner

US 9,858,916 B2

SOUND PROCESSING METHOD AND TERMINAL DEVICE

CROSS-REFERENCE TO RELATED APPLICATIONS

This application is a continuation of International Application No. PCT/CN2014/090210, filed on Nov. 4, 2014, which claims priority to Chinese Patent Application No. 201310552516.2, filed on Nov. 7, 2013, both of which are hereby incorporated by reference in their entireties.

TECHNICAL FIELD

The present disclosure relates to the field of terminal device, and more specifically, to a sound processing method and a terminal device.

BACKGROUND

As a multimedia function and an application of a mobile phone are increasingly diverse, a Karaoke application, as an emerging application, is increasingly welcomed. In this type of application, accompanying sound or an accompanying video is played, a sound of a singer is recorded by using a microphone, and after beautification processing is performed on the sound of the singer, the sound of the singer is synthesized with the accompanying sound or the accompanying video. Typical applications include Oke Hero, Chang Ba, and the like.

A Karaoke technology has an extremely high requirement on a delay of a sound recording/playing channel (the delay is less than 50 millisecond (ms)); otherwise, a human ear can sense that beautified sound is delayed as compared to a sound of a singer, and the delay is mainly caused by a software platform. For example, on the Android platform, a designed delay of an application layer is relatively long (greater than 100 ms); therefore, if a sound is input in real time, beautified in real time, and output in real time, a beautified and output sound is obviously delayed as compared to a sound of a singer.

SUMMARY

Embodiments of the present disclosure provide a sound processing method and a terminal device, which can reduce a delay of a sound on which beautification processing is performed, thereby implementing real-time input, real-time beautification, and real-time output of the sound.

According to a first aspect, a sound processing method is provided, including: acquiring an analog first sound signal; performing analog-to-digital conversion on the first sound signal, so as to generate a digital second sound signal; performing reverberation processing, at a system bottom layer, on the second sound signal, so as to generate a digital third sound signal, where the system bottom layer includes at least one of a framework layer, a hardware abstraction layer, a driver layer, and a coder-decoder (CODEC) layer; performing digital sound mixing processing on the third sound signal and a background sound signal sent from an application layer, so as to generate a digital fourth sound signal; performing digital-to-analog conversion on the fourth sound signal, so as to generate an analog fifth sound signal; performing analog sound mixing processing on the first sound signal and the fifth sound signal, so as to generate an analog sixth sound signal; and playing the sixth sound signal.

With reference to the first aspect, in a first implementation manner of the first aspect, when the system bottom layer includes at least one of the framework layer, the hardware abstraction layer, and the driver layer, the performing reverberation processing, at a system bottom layer, on the second sound signal, so as to generate a digital third sound signal includes: sending, through a recording channel, the second sound signal to a reverberation apparatus located at the system bottom layer; and performing reverberation processing on the second sound signal by using the reverberation apparatus, so as to generate the third sound signal with a reverberation effect.

With reference to the first aspect and the foregoing implementation manner of the first aspect, in a second implementation manner of the first aspect, when the system bottom layer is the CODEC layer, the performing reverberation processing, at a system bottom layer, on the second sound signal, so as to generate a digital third sound signal includes: performing, by using a digital signal processing apparatus located at the CODEC layer, reverberation processing on the second sound signal, so as to generate the third sound signal with a reverberation effect.

With reference to the first aspect and the foregoing implementation manners of the first aspect, in a third implementation manner of the first aspect, the performing digital sound mixing processing on the third sound signal and a background sound signal sent from an application layer, so as to generate a digital fourth sound signal includes: performing superposition on the third sound signal and the background sound signal by using a digital sound mixing apparatus located at the system bottom layer, so as to generate the fourth sound signal, where the background sound signal is a digital signal.

With reference to the first aspect and the foregoing implementation manners of the first aspect, in a fourth implementation manner of the first aspect, the performing analog sound mixing processing on the first sound signal and the fifth sound signal, so as to generate an analog sixth sound signal includes: performing superposition on the first sound signal and the fifth sound signal by using an analog sound mixing apparatus located at the CODEC layer, so as to generate the sixth sound signal.

With reference to the first aspect and the foregoing implementation manners of the first aspect, in a fifth implementation manner of the first aspect, after the analog first sound signal is acquired by using a sound collecting apparatus, the method further includes: sending, through a sidetone channel at the CODEC layer, the acquired first sound signal to the analog sound mixing apparatus located at the CODEC layer.

According to a second aspect, a terminal device is provided, including: a sound collecting apparatus, an analog-to-digital conversion apparatus, a reverberation apparatus, a digital sound mixing apparatus, a digital-to-analog conversion apparatus, an analog sound mixing apparatus, and a sound playing apparatus. The sound collecting apparatus, the sound playing apparatus, the analog-to-digital conversion apparatus, the digital-to-analog conversion apparatus, and the analog sound mixing apparatus are located at a CODEC layer. The reverberation apparatus and the digital sound mixing apparatus are located at a system bottom layer, where the system bottom layer includes at least one of a framework layer, a hardware abstraction layer, a driver layer, and the CODEC layer. The sound collecting apparatus is connected to the analog sound mixing apparatus through a sidetone channel, and the sound collecting apparatus is configured to acquire an analog first sound signal. The analog-to-digital conversion apparatus is configured to perform analog-to-digital conversion on the first sound signal, so as to generate a digital second sound signal. The reverberation apparatus is configured to perform reverberation processing, at the system bottom layer, on the second sound signal, so as to generate a digital third sound signal. The digital sound mixing apparatus is configured to perform digital sound mixing processing on the third sound signal and a background sound signal sent from an application layer, so as to generate a digital fourth sound signal. The digital-to-analog conversion apparatus is configured to perform digital-to-analog conversion on the fourth sound signal, so as to generate an analog fifth sound signal; the analog sound mixing apparatus is configured to perform analog sound mixing processing on the first sound signal and the fifth sound signal, so as to generate an analog sixth sound signal. The sound playing apparatus is configured to play the sixth sound signal.

With reference to the second aspect, in a first implementation manner of the second aspect, when the reverberation apparatus is located at at least one of the framework layer, the hardware abstraction layer, and the driver layer, the reverberation apparatus is specifically configured to: receive, through the recording channel, the second sound signal sent by the analog-to-digital conversion apparatus; perform reverberation processing on the second sound signal, so as to generate the third sound signal with a reverberation effect; and send the third sound signal to the digital sound mixing apparatus.

With reference to the second aspect and the foregoing implementation manner of the second aspect, in a second implementation manner of the second aspect, the terminal further includes a digital signal processing apparatus, and when the reverberation apparatus is located at the CODEC layer, the reverberation apparatus is specifically configured to: receive the second sound signal sent by the analog-to-digital conversion apparatus; perform, by using the digital signal processing apparatus located at the CODEC layer, reverberation processing on the second sound signal, so as to generate the third sound signal with a reverberation effect; and send the third sound signal to the digital sound mixing apparatus.

With reference to the second aspect and the foregoing implementation manners of the second aspect, in a third implementation manner of the second aspect, the digital sound mixing apparatus is specifically configured to: receive the third sound signal sent by the reverberation apparatus, and receive the background sound signal sent by the application layer; perform superposition on the third sound signal and the background sound signal, so as to generate the fourth sound signal, where the background sound signal is a digital signal; and send the fourth sound signal to the digital-to-analog conversion apparatus.

With reference to the second aspect and the foregoing implementation manners of the second aspect, in a fourth implementation manner of the second aspect, the analog sound mixing apparatus is specifically configured to: perform superposition on the first sound signal and the fifth sound signal, so as to generate the sixth sound signal.

With reference to the second aspect and the foregoing implementation manners of the second aspect, in a fifth implementation manner of the second aspect, the sound acquiring apparatus is further configured to: send the acquired first sound signal to the analog sound mixing apparatus through the sidetone channel.

With reference to the second aspect and the foregoing implementation manners of the second aspect, in a sixth implementation manner of the second aspect, the sound collecting apparatus is a microphone, the sound playing apparatus is a loudspeaker, the digital-to-analog conversion apparatus and the analog-to-digital conversion apparatus are digital-to-analog/analog-to-digital converters, and the reverberation apparatus, the digital sound mixing apparatus, and the analog sound mixing apparatus are codec chips.

In the embodiments of the present disclosure, by performing reverberation beautification processing, at a system bottom layer, on a sound signal, a delay of a sound on which beautification processing is performed can be reduced, thereby implementing real-time input, real-time beautification, and real-time output of the sound and improving user experience.

BRIEF DESCRIPTION OF DRAWINGS

To describe the technical solutions in the embodiments of the present disclosure more clearly, the following briefly introduces the accompanying drawings required for describing the embodiments of the present disclosure. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are a part rather than all of the embodiments of the present disclosure. All other embodiments obtained by a person of ordinary skill in the art based on the embodiments of the present disclosure without creative efforts shall fall within the protection scope of the present disclosure.

Figure 1:
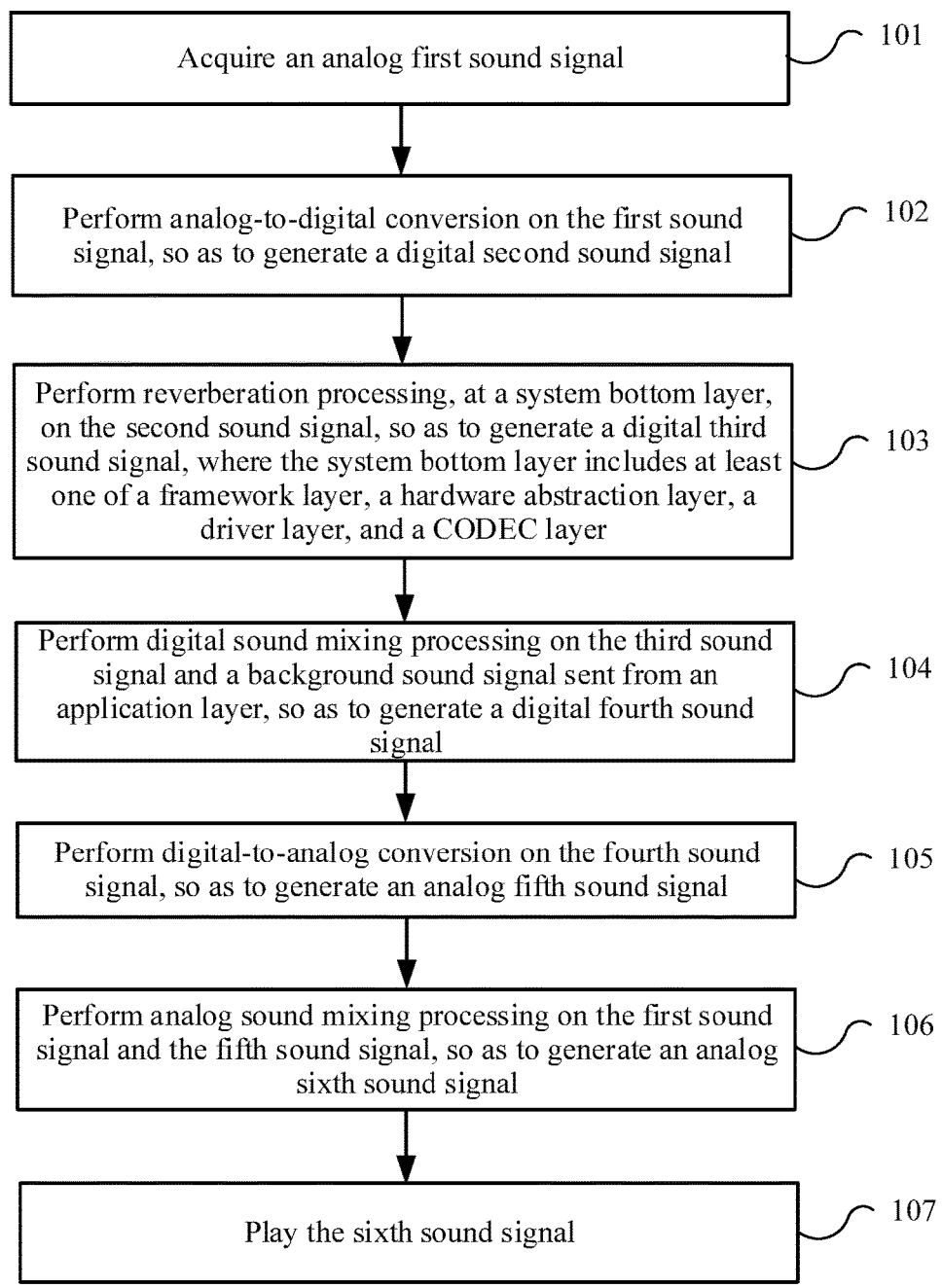
FIG. 1 is a flowchart of a sound processing method according to an embodiment of the present disclosure.

FIG. 1 is a flowchart of a sound processing method according to an embodiment of the present disclosure. The method in FIG. 1 may be executed by a terminal device.

Step 101: Acquire an analog first sound signal.

Step 102: Perform analog-to-digital conversion on the first sound signal, so as to generate a digital second sound signal.

Step 103: Perform reverberation processing, at a system bottom layer, on the second sound signal, so as to generate a digital third sound signal, where the system bottom layer includes at least one of a framework layer, a hardware abstraction layer, a driver layer, and a CODEC layer.

Step 104: Perform digital sound mixing processing on the third sound signal and a background sound signal sent from an application layer, so as to generate a digital fourth sound signal.

Step 105: Perform digital-to-analog conversion on the fourth sound signal, so as to generate an analog fifth sound signal.

Step 106: Perform analog sound mixing processing on the first sound signal and the fifth sound signal, so as to generate an analog sixth sound signal.

Step 107: Play the sixth sound signal.

In this embodiment of the present disclosure, by performing reverberation beautification processing, at a system bottom layer, on a sound signal, a delay of a sound on which beautification processing is performed can be reduced, thereby implementing real-time input, real-time beautification, and real-time output of the sound and improving user experience.

It should be understood that the terminal device in this embodiment of the present disclosure may be a handheld mobile terminal, for example, a mobile phone or a tablet computer; or may be a portable, pocket-size, handheld, computer built-in, or vehicle-mounted terminal device, which is not limited in the present disclosure.

A system of the terminal device in this embodiment of the present disclosure may be divided into the following five layers according to a logical structure: an application layer (Application Layer), a framework layer (Framework Layer), a hardware abstraction layer (Hardware Abstraction Layer (HAL)), a driver layer (Driver Layer), and a codec (Coder-Decoder Layer, CODEC) layer, where the CODEC layer belongs to a hardware layer. The framework layer, the hardware abstraction layer, the driver layer, and the CODEC layer that are below the application layer may be referred to as a system bottom layer.

Optionally, in an embodiment, when the system bottom layer includes at least one of the framework layer, the hardware abstraction layer, and the driver layer, step 103 may include: sending, through a recording channel, the second sound signal to a reverberation apparatus located at the system bottom layer; and performing reverberation processing on the second sound signal by using the reverberation apparatus, so as to generate the third sound signal with a reverberation effect.

In other words, when reverberation processing is performed, at any one or more of the framework layer, the hardware abstraction layer, and the driver layer, on the second sound signal generated after analog-to-digital conversion, the second sound signal may be sent to the reverberation apparatus through the recording channel. The recording channel may lead straight to the application layer. The reverberation apparatus may be an algorithm module (reverberation algorithm model) that is configured to beautify a sound, where the reverberation algorithm model is mainly configured to add a reverberation effect, a sound effect of a balancer, and the like to a sound signal that is input. Specifically, the reverberation algorithm model may be a combination of one or more of a multistage-delay reverberation algorithm model, a comb filtering reverberation algorithm model, a Schroeder reverberation algorithm model, and a Moorer reverberation algorithm model. A relatively commonly used reverberation algorithm model may be formed by connecting multiple low-pass filter modules in parallel, and then connecting the multiple low-pass filter modules and multiple all-pass filter modules in series. To achieve an echo effect, delays of the multiple low-pass filter modules may be different.

Optionally, when step 103 is being performed, the second sound signal may be sent to the application layer through the recording channel simultaneously; and optionally, after step 103, the third sound signal may be sent to the application layer through the recording channel, so that a specific application program processes and saves a sound signal of a user, and the user may perform subsequent operations such as playback and release.

Optionally, in an embodiment, when the system bottom layer is the CODEC layer, step 103 may include: performing, by using a digital signal processing apparatus located at the CODEC layer, reverberation processing on the second sound signal, so as to generate the third sound signal with a reverberation effect.

In other words, if reverberation processing is performed, at the codec layer, on the second sound signal generated after analog-to-digital conversion, the second sound signal may be sent to a digital signal processing (DSP) apparatus located in the CODEC for reverberation processing. Specifically, a reverberation processing method and model of the DSP apparatus in the CODEC are similar to a processing method at the foregoing framework layer, the hardware abstraction layer, or the driver layer, and details are not described herein again.

Optionally, in an embodiment, step 104 may include: performing superposition on the third sound signal and the background sound signal by using a digital sound mixing apparatus located at the system bottom layer, so as to generate the fourth sound signal, where the background sound signal is a digital signal.

In other words, after reverberation processing is performed, at any one or more of the framework layer, the hardware abstraction layer, and the driver layer, on the second sound signal generated after analog-to-digital conversion, the generated third sound signal may be sent to the digital sound mixing apparatus that is also located at any one or more of the framework layer, the hardware abstraction layer, and the driver layer; in addition, the digital sound mixing apparatus may also receive a background sound signal of a "Karaoke" application at the application layer, for example, accompanying music. Two signals, that is, the third sound signal and the background sound signal, are directly added up, or the two signals with gains are added up, or superposition may be performed on the two signals by using another reverberation processing algorithm, which is not limited in the present disclosure. Afterward, the fourth sound signal generated after reverberation and superposition may be sent to the digital-to-analog conversion apparatus.

Optionally, in an embodiment, after step 101, the method may further include: sending, through a sidetone channel at the CODEC layer, the acquired first sound signal to the analog sound mixing apparatus located at the CODEC layer. The sidetone channel may be an analog channel that connects a sound collecting apparatus and a sound playing apparatus. After being looped back through an analog channel, the first sound signal may be directly sent to an analog sound mixing apparatus on a sound playing apparatus end, and a delay is almost zero (less than 5 ms). Optionally, a gain of the first sound signal may be adjusted in a loopback process.

Optionally, in an embodiment, step 106 may include: performing superposition on the first sound signal and the fifth sound signal by using an analog sound mixing apparatus located at the CODEC layer, so as to generate the sixth sound signal.

Specifically, the analog sound mixing apparatus may directly add up two signals, that is, the fifth sound signal and the first sound signal, or add up the two signals with gains, or superposition may be performed on the two signals by using another reverberation processing algorithm, so as to generate the sixth sound signal, which is not limited in the present disclosure. The generated sixth sound signal may be output by using a loudspeaker.

In this embodiment of the present disclosure, a sound signal is divided into two signals for processing: one sound signal is looped back through an analog channel and then sent to an output port with almost no delay; the other sound signal is provided with reverberation beautification processing at a system bottom layer and sent to an output port together with a background sound signal; and the two signals are mixed and output. Therefore, a delay of a sound on which beautification processing is performed can be reduced, thereby implementing real-time input, real-time beautification, and real-time output of the sound and improving user experience.

Figure 2:
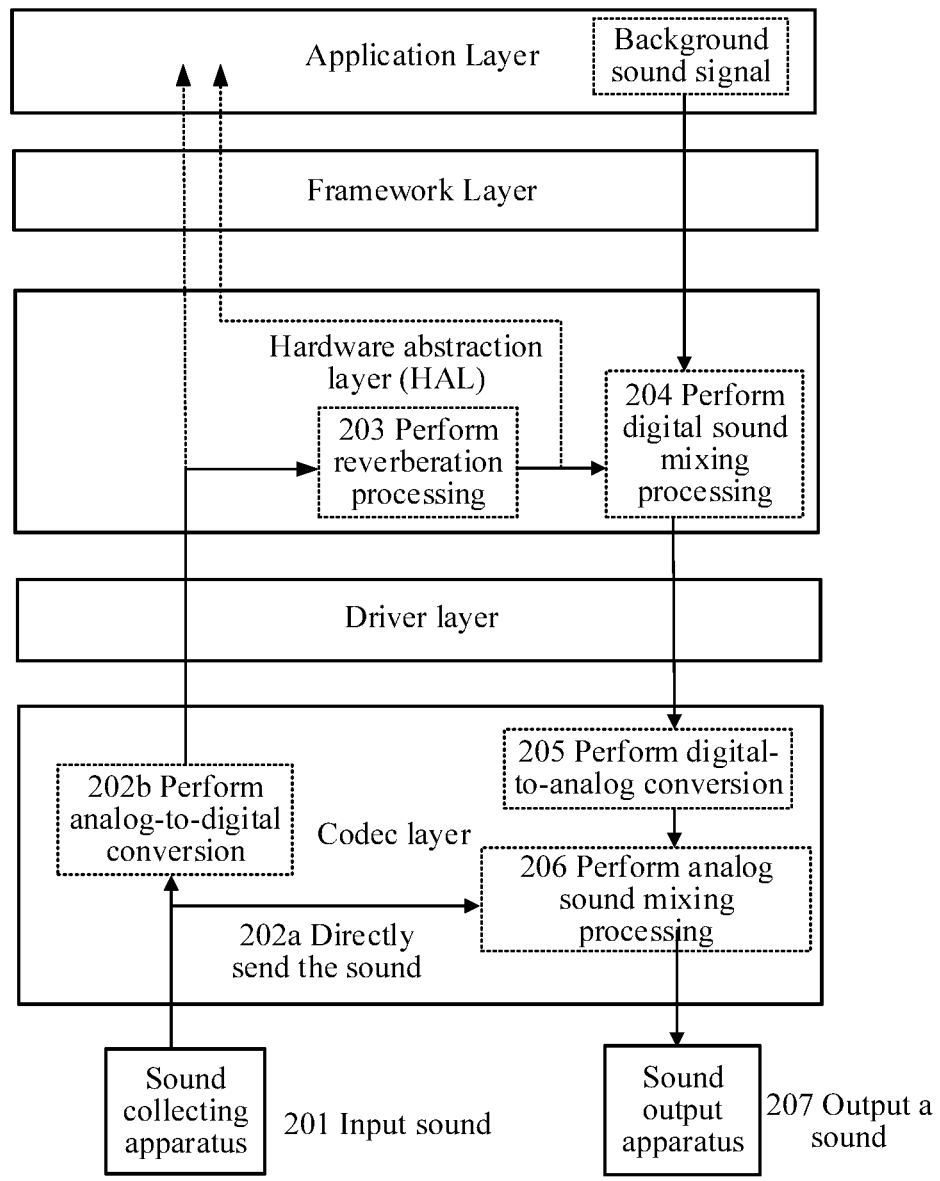
FIG. 2 is a flowchart of a sound processing method according to an embodiment of the present disclosure.

FIG. 2 is a flowchart of a sound processing method according to an embodiment of the present disclosure. The method in FIG. 2 may be executed by a terminal device, where the terminal device may be a handheld mobile terminal, for example, a mobile phone or a tablet computer, or may be a portable, pocket-size, handheld, computer built-in, or vehicle-mounted terminal device, which is not limited in the present disclosure.

Step 201: Input sound.

Audio of a singer is collected by using a sound collecting apparatus (for example, a microphone), so as to generate an analog first sound signal. Specifically, the sound of the singer may be collected when a background sound signal (for example, accompanying music) is being played.

Step 202a: Directly send the sound.

After being generated, the analog first sound signal may be sent to an output port by using a sidetone channel of a sound codec (CODEC). This sound signal may be referred to as "direct sound". Compared with a sound that is input by a user, the "direct sound" has almost no delay and does not have a beautification effect. In other words, after passing through the sidetone channel, spectrum of the first sound signal almost remains unchanged; a phase is hardly changed; and an amplitude may change according to a setting. A formula for the "direct sound" is as follows:

$$S_D = G_D * S(t - \tau_D),$$

where $S_D$ indicates a direct sound; $G_D$ indicates a direct sound gain; $\tau_D$ indicates a direct sound delay (less than 5 ms); and S indicates an original signal, that is, the first sound signal. Because spectrum of $S_D$ remains unchanged as compared to spectrum of S, $S_D$ may still be considered as the first sound signal.

Step 202b: Perform analog-to-digital conversion.

After the analog first sound signal is generated, in addition to the "direct sound" in 202a, the first sound signal may also be sent to an analog-to-digital conversion apparatus, so as to generate a digital second sound signal, so that a next step of signal processing can be performed.

Step 203: Perform reverberation processing.

The second sound signal is sent to a reverberation apparatus for reverberation beautification processing, so as to generate "beautified sound". The reverberation apparatus may be located at any one or more of a framework layer, a hardware abstraction layer HAL, a driver layer, and a codec layer. For example, when the reverberation apparatus is located at the HAL, the second sound signal may be sent, through a recording channel, to the reverberation apparatus at the HAL for reverberation beautification processing.

Figure 3:
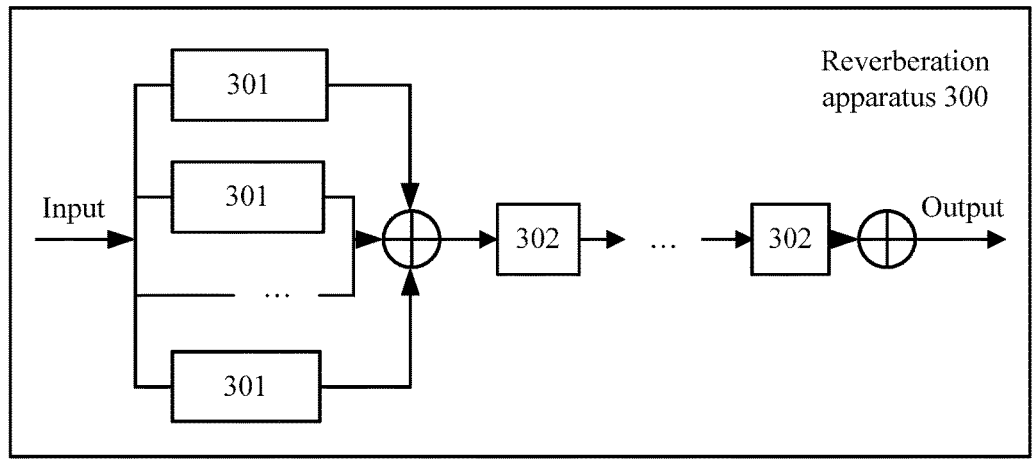
FIG. 3 is a schematic diagram of a reverberation model according to an embodiment of the present disclosure.

Specifically, the reverberation apparatus may be an algorithm module (reverberation algorithm model) that is configured to "beautify a sound"; in other words, the reverberation apparatus at the HAL belongs to software logic apparatus, and actual calculation and processing are executed by a hardware layer. This reverberation algorithm model is mainly configured to add a reverberation effect, a sound effect of a balancer, and the like to a sound signal that is input. Specifically, the reverberation algorithm model may be a combination of one or more of a multistage-delay reverberation algorithm model, a comb filtering reverberation algorithm model, a Schroeder reverberation algorithm model, and a Moorer reverberation algorithm. As an example, FIG. 3 shows a schematic structural diagram of a reverberation apparatus 300. As shown in FIG. 3, the reverberation apparatus 300 may be formed by connecting multiple low-pass filter modules 301 in parallel, and then connecting the multiple low-pass filter modules 301 and multiple all-pass filter modules 302 in series. To achieve an echo effect, delays of the multiple low-pass filter modules may be different.

Figure 4:
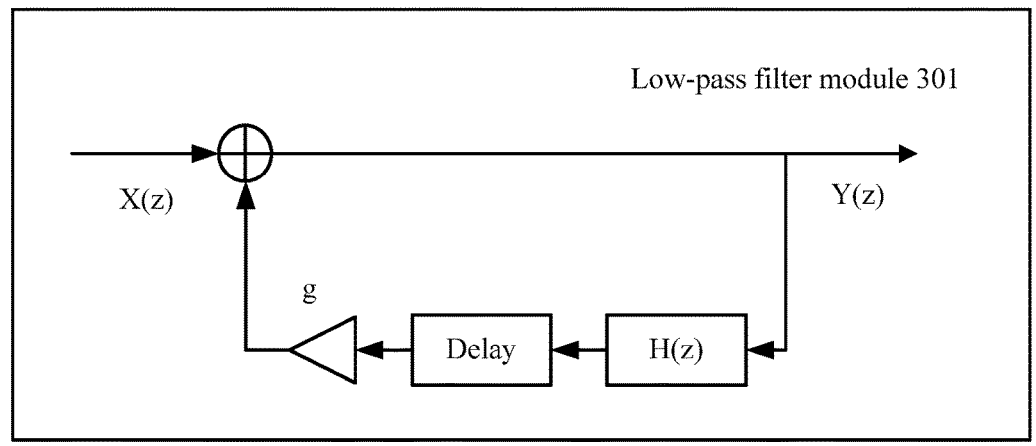
FIG. 4 is a schematic diagram of a low-pass filter model according to an embodiment of the present disclosure.

More specifically, a schematic structural diagram of any filter module of the low-pass filter modules 301 in FIG. 3 may be shown in FIG. 4. A transmission function H(z) of the low-pass filter modules 301 may be:

$$H(z) = \frac{Y(z)}{X(z)} = \frac{1-g}{1-g*z^{-1}},$$

where X(z) is an input signal; Y(z) is an output signal; g is a gain; and $Z^{-n}$ is a delay of n unit or units, where a delay of one unit may be a sampling time.

After the second sound signal passes through the low-pass filter modules 301, the $Z^{-n}$ delay is generated. However, after multiple second sound signals pass through multiple low-pass filter modules that are connected in parallel and have different delays, and superposition is performed on the signals, a sound signal with an effect of "multiple echoes" as compared to an original sound signal is generated.

Figure 5:
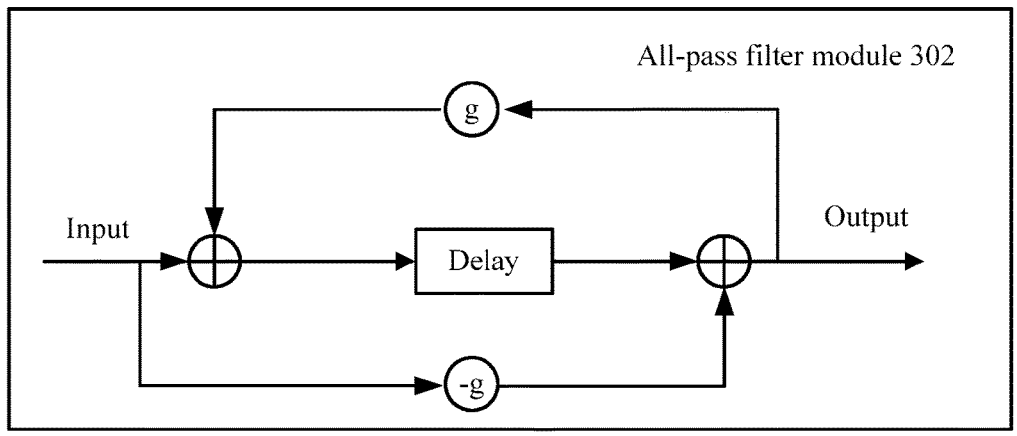
FIG. 5 is a schematic diagram of an all-pass filter model according to an embodiment of the present disclosure.

More specifically, a schematic structural diagram of any filter module of the all-pass filter module 302 in FIG. 3 may be shown in FIG. 5. A transmission function H(z) of the all-pass filter modules 302 may be:

$$H(z) = \frac{Z^{-D} - g}{1 - gZ^{-D}} = \frac{Z^{-D}}{1 - gZ^{-D}} - \frac{g}{1 - gZ^{-D}},$$

where g is a gain; and $Z^{-D}$ is a delay of D unit or units. Further "beautification processing" may be performed, by using multiple all-pass filter modules 302 that are connected in series, on the second sound signal of the low-pass filter model 301, so as to generate a third sound signal.

In addition, if the reverberation apparatus is located at the CODEC layer, the second sound signal generated after analog-to-digital conversion may be sent to a digital signal processor DSP located in the CODEC, where the digital signal processor may perform, on the second sound signal, "beautification processing" that is similar to beautification processing of the reverberation apparatus at the foregoing HAL. The DSP in the CODEC further has processing functions such as call noise reduction, encoding/decoding, recording, and recording beautification.

It should be understood that the recording channel may lead straight to an application layer; however, a relatively greater delay is caused when a signal or an instruction passes through each layer of a system due to instability of the system, so that if the signal is sent to the application layer through a recording channel and returned to a hardware layer, it is very likely that the delay is greater than 100 ms, which is "distinguishable" to a user; in other words, a user may obviously sense that returned sound is delayed as compared to a sound that is sent by the user. Therefore, a feeling of "Karaoke" is gone, and user experience is deteriorated. However, a reverberation apparatus that is configured to perform beautification processing in this embodiment is located below the application layer, which greatly reduces a quantity of system layers a sound signal needs to pass through when the sound signal comes back and forth during processing of the sound signal; and a delay may be reduced to less than 50 ms, and the user senses "echo" instead of the delay.

As an optional step, when reverberation processing is performed on the second sound signal by using the reverberation apparatus at the system bottom layer, the second sound signal may be sent to the application layer through the recording channel, so that a specific application program processes and saves the second sound signal, and the user may perform subsequent operations such as playback and release.

Similarly, as another optional step, after the third sound signal is generated after the reverberation processing is performed on the second sound signal in step 203, the third sound signal may also be sent to the application layer through the recording channel, so that a specific application program processes and saves the second sound signal, and the user may perform subsequent operations such as playback and release.

Step 204: Perform digital sound mixing processing.

Similar to the reverberation apparatus, a digital sound mixing apparatus may also be located at any one or more of a framework layer, a HAL, a driver layer, and a codec layer. HAL is used as an example. The digital sound mixing apparatus receives the third sound signal sent by the reverberation apparatus. In addition, the digital sound mixing apparatus receives a background sound signal (for example, accompanying music) from the application layer. After the digital sound mixing apparatus performs linear or non-linear superposition processing on two signals, a fourth sound signal with "beautified sound" and "an accompaniment" is generated. The superposition may be directly adding up the two signals, or adding up the two signals with gains, or superposition may be performed on the two signals by using another reverberation processing algorithm, which is not limited in the present disclosure.

Similar to the reverberation apparatus, the digital sound mixing apparatus also belongs to a software logic apparatus, and an actual calculation and processing are executed by a hardware layer.

Step 205: Perform digital-to-analog conversion.

The fourth sound signal is sent to a digital-to-analog conversion apparatus, so as to generate an analog fifth sound signal, and the fifth sound signal is sent to an analog sound mixing apparatus for processing of a next step.

Step 206: Perform analog sound mixing processing.

The analog sound mixing apparatus receives the first sound signal generated in step 202*a*, and receives the fifth sound signal generated in step 205 at the same time, and then linear or non-linear superposition is performed on the two signals, so as to generate a sixth sound signal. The superposition may be directly adding up the two signals, or adding up the two signals with gains, or superposition may be performed on the two signals by using another reverberation processing algorithm, which is not limited in the present disclosure.

Step 207: Output sound.

The sixth sound signal may be played by using a sound playing apparatus, which enables a user to hear the "direct sound", the "beautified sound", and the "accompaniment", and because a delay of the "beautified sound" is less than 50 ms, a singer can sense echo of a sound of the singer instead of the delay.

In this embodiment of the present disclosure, a sound signal is divided into two signals for processing: one sound signal is looped back through an analog channel and then sent to an output port with almost no delay; the other sound signal is provided with reverberation beautification processing at a system bottom layer and sent to an output port together with a background sound signal; and the two signals are mixed and output. Therefore, a delay of a sound on which beautification processing is performed can be reduced, thereby implementing real-time input, real-time beautification, and real-time output of the sound and improving user experience.

Figure 6:
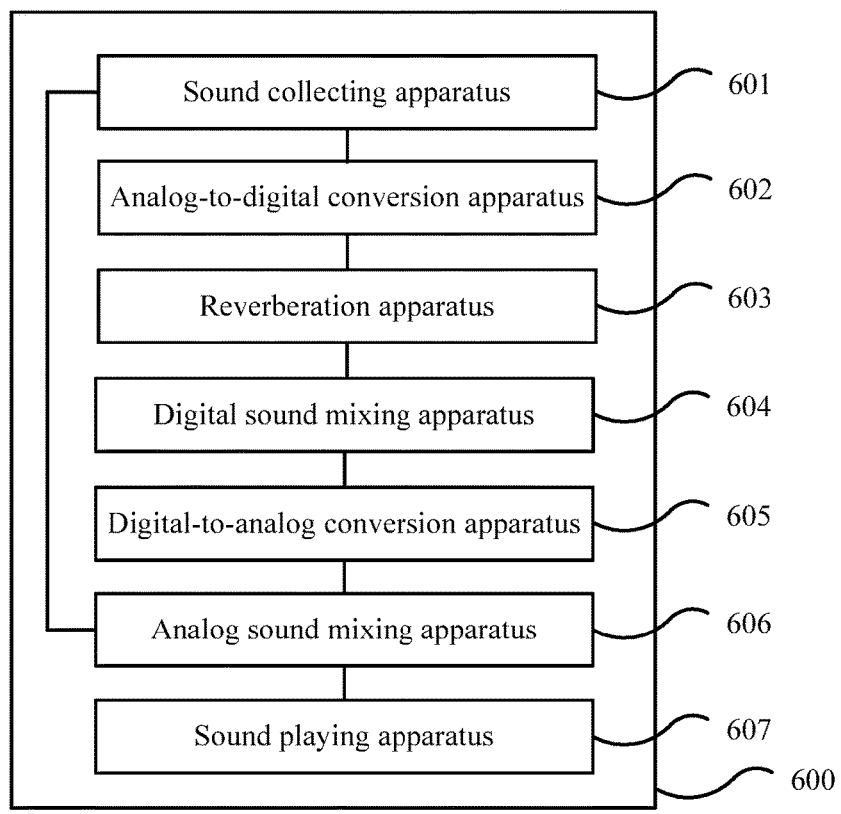
FIG. 6 is a schematic block diagram of a terminal device according to an embodiment of the present disclosure.

FIG. 6 is a schematic block diagram of a sound processing terminal according to an embodiment of the present disclosure. A sound processing terminal 600 shown in FIG. 6 includes a sound collecting apparatus 601, an analog-to-digital conversion apparatus 602, a reverberation apparatus 603, a digital sound mixing apparatus 604, a digital-to-analog conversion apparatus 605, an analog sound mixing apparatus 606, and a sound playing apparatus 607, where: the sound collecting apparatus 601, the sound playing apparatus 607, the analog-to-digital conversion apparatus 602, the digital-to-analog conversion apparatus 605, and the analog sound mixing apparatus 606 are located at a CODEC layer, and the reverberation apparatus 603 and the digital sound mixing apparatus 604 are located at a system bottom layer; the system bottom layer includes at least one of a framework layer, a hardware abstraction layer, a driver layer, and the CODEC layer; and the sound collecting apparatus 601 is connected to the analog sound mixing apparatus 606 through a sidetone channel.

The sound collecting apparatus 601 acquires an analog first sound signal. The analog-to-digital conversion apparatus 602 performs analog-to-digital conversion on the first sound signal, so as to generate a digital second sound signal. The reverberation apparatus 603 performs reverberation processing, at the system bottom layer, on the second sound signal, so as to generate a digital third sound signal. The digital sound mixing apparatus 604 performs digital sound mixing processing on the third sound signal and a background sound signal sent from an application layer, so as to generate a digital fourth sound signal. The analog-to-digital conversion apparatus 605 performs digital-to-analog conversion on the fourth sound signal, so as to generate an analog fifth sound signal. The analog sound mixing apparatus 606 performs analog sound mixing processing on the first sound signal and the fifth sound signal, so as to generate an analog sixth sound signal. The sound playing apparatus 607 plays the sixth sound signal.

In this embodiment of the present disclosure, by performing reverberation beautification processing, at a system bottom layer, on a sound signal, a delay of a sound on which beautification processing is performed can be reduced, thereby implementing real-time input, real-time beautification, and real-time output of the sound and improving user experience.

It should be understood that a terminal device in this embodiment of the present disclosure may be a handheld mobile terminal, for example, a mobile phone or a tablet computer; or may be a portable, pocket-size, handheld, computer built-in, or vehicle-mounted terminal device, which is not limited in the present disclosure.

A system of the terminal device in this embodiment of the present disclosure may be divided into the following five layers according to a logical structure: an application layer, a framework layer, a HAL, a driver layer, and a CODEC layer, where the CODEC layer belongs to a hardware layer. The framework layer, the hardware abstraction layer, the driver layer, and the CODEC layer that are below the application layer may be referred to as a system bottom layer.

Optionally, in an embodiment, when the reverberation apparatus 603 is located at at least one of the framework layer, the hardware abstraction layer, and the driver layer, the reverberation apparatus 603 is specifically configured to: receive, through the recording channel, the second sound signal sent by the analog-to-digital conversion apparatus 602; perform reverberation processing on the second sound signal, so as to generate the third sound signal with a reverberation effect; and send the third sound signal to the digital sound mixing apparatus 604.

In other words, when reverberation processing is performed, at any one or more of the framework layer, the hardware abstraction layer, and the driver layer, on the second sound signal generated after analog-to-digital conversion, the second sound signal may be sent to the reverberation apparatus through the recording channel. The recording channel may lead straight to the application layer. The reverberation apparatus may be an algorithm module (reverberation algorithm model) that is configured to beautify a sound, where the reverberation algorithm model is mainly configured to add a reverberation effect, a sound effect of a balancer, and the like to a sound signal that is input. Specifically, the reverberation algorithm model may be a combination of one or more of a multistage-delay reverberation algorithm model, a comb filtering reverberation algorithm model, a Schroeder reverberation algorithm model, and a Moorer reverberation algorithm model. A relatively commonly used reverberation algorithm module may be formed by connecting multiple low-pass filter modules in parallel, and then connecting the multiple low-pass filter model and multiple all-pass filter modules in series. To achieve an echo effect, delays of the multiple low-pass filter modules may be different.

Optionally, in an embodiment, the sound processing terminal 600 further includes a digital signal processing apparatus, and when the reverberation apparatus 603 is located at the CODEC layer, the reverberation apparatus 603 is specifically configured to: receive the second sound signal sent by the analog-to-digital conversion apparatus 602; perform low-pass filtering and all-pass filtering on the second sound signal by using the digital signal processing apparatus located at the CODEC layer, so as to generate the third sound signal with a reverberation effect; and send the third sound signal to the digital sound mixing apparatus 604.

In other words, if reverberation processing is performed, at the codec layer, on the second sound signal generated after analog-to-digital conversion, the second sound signal may be sent to a DSP apparatus located in the CODEC for reverberation processing. Specifically, a reverberation processing method and model of the DSP apparatus in the CODEC are similar to a processing method at the foregoing framework layer, the hardware abstraction layer, or the driver layer, and details are not described herein again.

Optionally, in an embodiment, the digital sound mixing apparatus 604 is specifically configured to: receive the third sound signal sent by the reverberation apparatus 603, and receive the background sound signal sent from the application layer; perform superposition on the third sound signal and the background sound signal, so as to generate the fourth sound signal, where the background sound signal is a digital signal; and send the fourth sound signal to the digital-to-analog conversion apparatus 605.

In other words, after reverberation processing is performed, at any one or more of the framework layer, the hardware abstraction layer, and the driver layer, on the second sound signal generated after analog-to-digital conversion, the generated third sound signal is sent to the digital sound mixing apparatus 604 that is also located at any one or more of the framework layer, the hardware abstraction layer, and the driver layer; in addition, the digital sound mixing apparatus 604 may also receive a background sound signal of a "Karaoke" application at the application layer, for example, accompanying music. Two signals, that is, the third sound signal and the background sound signal, are directly added up, or the two signals with gains are added up, or superposition may be performed on the two signals by using another reverberation processing algorithm, which is not limited in the present disclosure. Afterward, the fourth sound signal generated after reverberation and superposition may be sent to the digital-to-analog conversion apparatus 605.

Optionally, in an embodiment, the sound acquiring apparatus 601 is further configured to: send the acquired first sound signal to the analog sound mixing apparatus 606 through the sidetone channel. The sidetone channel may be an analog channel that connects a sound collecting apparatus and a sound playing apparatus. After being looped back through an analog channel, the first sound signal may be directly sent to an analog sound mixing apparatus of the sound playing apparatus, and a delay is almost zero (less than 5 ms). Optionally, a gain of the first sound signal may be adjusted in a loopback process.

Optionally, in an embodiment, the analog sound mixing apparatus 606 is specifically configured to: perform superposition on the first sound signal and the fifth sound signal, so as to generate the sixth sound signal.

Specifically, digital-to-analog conversion is performed on the fourth sound signal, so as to generate an analog fifth sound signal; and the first sound signal is sent to the analog sound mixing apparatus through the sidetone channel. Two signals, that is, the fifth sound signal and the first sound signal, are directly added up, or the two signals with gains are added up, or superposition may be performed on the two signals by using another reverberation processing algorithm, so as to generate the sixth sound signal, which is not limited in the present disclosure. The generated sixth sound signal may be output by using a loudspeaker.

It can be understood that the analog-to-digital conversion apparatus 602 may be integrated with the digital-to-analog conversion apparatus 605, so as to form an analog-to-digital/digital-to-analog conversion apparatus.

In this embodiment of the present disclosure, a sound signal is divided into two signals for processing: one sound signal is looped back through an analog channel and then sent to an output port with almost no delay; the other sound signal is provided with reverberation beautification processing at a system bottom layer and sent to an output port together with a background sound signal; and the two signals are mixed and output. Therefore, a delay of a sound on which beautification processing is performed can be reduced, thereby implementing real-time input, real-time beautification, and real-time output of the sound and improving user experience.

Figure 7:
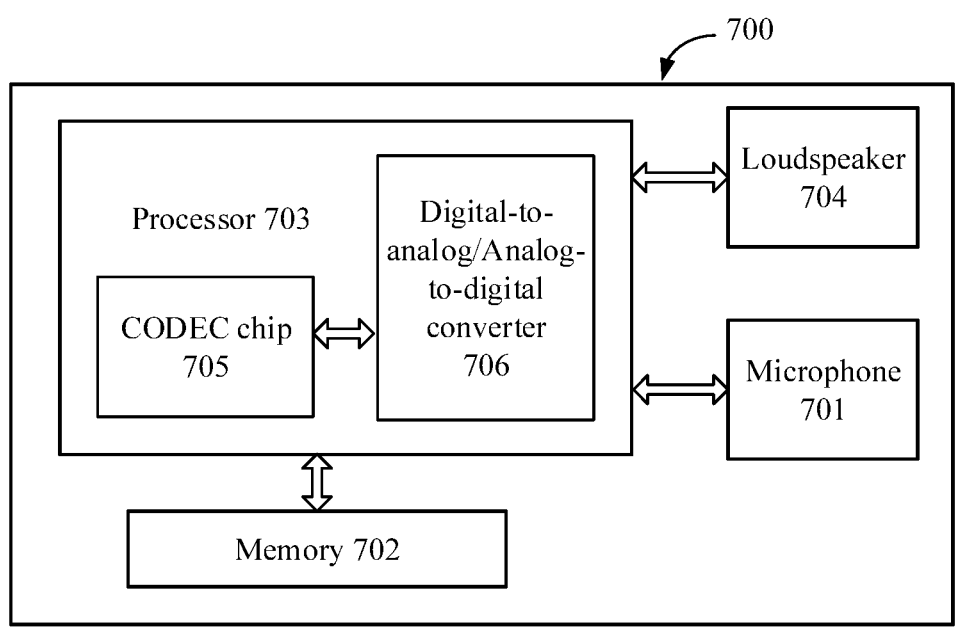
FIG. 7 is a schematic block diagram of a terminal device according to another embodiment of the present disclosure.

FIG. 7 is a schematic block diagram of a terminal device according to another embodiment of the present disclosure. The terminal device 700 in FIG. 7 includes a microphone 701, a processor 703, and a loudspeaker 704.

The microphone 701 is configured to acquire an analog first sound signal.

The processor 703 is configured to: perform analog-to-digital conversion on the first sound signal, so as to generate a digital second sound signal; perform reverberation processing, at a system bottom layer, on the second sound signal, so as to generate a digital third sound signal; perform digital sound mixing processing on the third sound signal and a background sound signal sent from an application layer, so as to generate a digital fourth sound signal; perform digital-to-analog conversion on the fourth sound signal, so as to generate an analog fifth sound signal; and perform analog sound mixing processing on the first sound signal and the fifth sound signal, so as to generate an analog sixth sound signal.

The loudspeaker 704 is configured to play the sixth sound signal.

In this embodiment of the present disclosure, by performing reverberation beautification processing, at a system bottom layer, on a sound signal, a delay of a sound on which beautification processing is performed can be reduced, thereby implementing real-time input, real-time beautification, and real-time output of the sound and improving user experience.

The terminal device may further include a memory 702, where the memory 702 may store an instruction that enables the processor 703 to perform an operation. It should be understood that the terminal device in this embodiment of the present disclosure may be a handheld mobile terminal, for example, a mobile phone or a tablet computer; or may be a portable, pocket-size, handheld, computer built-in, or vehicle-mounted terminal device, which is not limited in this embodiment of the present disclosure.

A system of the terminal device in this embodiment of the present disclosure may be divided into the following five layers according to a logical structure: an application layer, a framework layer, a HAL, a driver layer, and a CODEC layer, where the CODEC layer belongs to a hardware layer. The framework layer, the hardware abstraction layer, the driver layer, and the CODEC layer that are below the application layer may be referred to as a system bottom layer.

It should be understood that the processor 703 may be located at a hardware layer; the foregoing processing that is performed, at the system bottom layer, on a sound signal, may be executed by the processor 703 located at the hardware layer; a logic process or thread of the processor 703 is located at the system bottom layer, and a priority of the process or the thread is relatively high. Therefore, impact on the process or the thread due to an unsteady system or a delay is relatively low, and a processing speed and a responding speed of the processor 703 are relatively high.

Optionally, in an embodiment, the processor 703 may include a CODEC chip 705 and a digital-to-analog/analog-to-digital converter 706. The CODEC chip 705 is specifically configured to: receive, through a recording channel, a second sound signal obtained after conversion performed by the digital-to-analog/analog-to-digital converter 706; and perform reverberation processing on the second sound signal, so as to generate the third sound signal with a reverberation effect.

Optionally, in an embodiment, the processor 703 may include a digital-to-analog/analog-to-digital converter 706 and a CODEC chip 705. The CODEC chip 705 is specifically configured to: receive a second sound signal obtained after conversion performed by the digital-to-analog/analog-to-digital converter 706; and perform low-pass filtering and all-pass filtering on the second sound signal, so as to generate the third sound signal with a reverberation effect.

Optionally, in an embodiment, the processor 703 may include a digital-to-analog/analog-to-digital converter 706 and a CODEC chip 705. The CODEC chip 705 is specifically configured to: receive a background sound signal sent from the application layer; perform superposition on a third sound signal and the background sound signal, so as to generate a fourth sound signal, where the background sound signal is a digital signal; and send the fourth sound signal to the digital-to-analog/analog-to-digital converter 706. The digital-to-analog/analog-to-digital converter 706 converts the digital fourth sound signal into the fifth sound signal.

Optionally, in an embodiment, the microphone 701 is further configured to: send the acquired first sound signal to the processor 703. The sidetone channel may be an analog channel that connects the processor 701 to the microphone 701 and the loudspeaker 704. After being looped back through an analog channel loopback, the first sound signal may be directly sent to the CODEC chip 705, and a delay is almost zero (less than 5 ms). Optionally, a gain of the first sound signal may be adjusted in a loopback process.

Optionally, in an embodiment, the processor 703 is specifically configured to: perform superposition on a first sound signal and a fifth sound signal, so as to generate a sixth sound signal.

In this embodiment of the present disclosure, a sound signal is divided by the terminal device 700 into two signals for processing: one sound signal is looped back through an analog channel and then sent to an output port with almost no delay; the other sound signal is provided with reverberation beautification processing at a system bottom layer and sent to an output port together with a background sound signal; and the two signals are mixed and output. Therefore, a delay of a sound on which beautification processing is performed can be reduced, thereby implementing real-time input, real-time beautification, and real-time output of the sound and improving user experience.

It should be noted that the processor 703 in this embodiment of the present disclosure includes the CODEC chip 705 and the digital-to-analog/analog-to-digital converter 706, where the CODEC chip 705 and the digital-to-analog/analog-to-digital converter 706 may be disposed separately, or may be integrated, which is not limited in this embodiment of the present disclosure.

The methods disclosed in the foregoing embodiments of the present disclosure may be applied to a processor, or implemented by a processor. The processor may be an integrated circuit chip and has a signal processing capability. During the implementation, all steps of the foregoing method may be completed by an integrated logic circuit of hardware or instructions in software forms in the processor. The processor may be a universal processor, a DSP, an application-specific integrated circuit (ASIC), a field programmable gate array (FPGA) or another programmable logical device, a stand-alone gate or a transistor logic device, or a stand-alone hardware device, and may implement or execute the methods, the steps, and the logical block diagrams disclosed in the embodiments of the present disclosure. The general purpose processor may be a microprocessor or the processor may be any conventional processor, or the like. The steps of the methods disclosed in the embodiments of the present disclosure may be directly executed by a hardware decoding processor, or executed by a combination of hardware and software modules in a decoding processor. The software module may be located in a mature storage medium in the art, such as a random access memory, a flash memory, a read-only memory, a programmable read-only memory, an electrically erasable programmable read-only memory or a register. The storage medium is located in the memory. The processor reads information from the memory, and completes the steps of the foregoing methods in combination with the hardware.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person of ordinary skill in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present disclosure. The storage medium includes: any medium that can store program codes, such as a universal serial bus (USB) flash disk, a removable hard disk, a read-only memory (ROM), a random-access memory (RAM), a magnetic disk, or an optical disk.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A sound processing method, comprising:
   acquiring an analog first sound signal;
   splitting the analog first sound signal into a first portion of the analog first sound signal and a second portion of the analog first sound signal;
   performing analog-to-digital conversion on the first portion of the analog first sound signal to generate a digital second sound signal;
   performing reverberation processing on the digital second sound signal to generate a digital third sound signal;
   receiving a background sound signal from an application;
   performing digital sound mixing processing on the digital third sound signal and the background sound signal to generate a digital fourth sound signal;
   performing digital-to-analog conversion on the digital fourth sound signal to generate an analog fifth sound signal;
   performing analog sound mixing processing on the second portion of the analog first sound signal and the analog fifth sound signal to generate an analog sixth sound signal; and
   playing the analog sixth sound signal.

2. The method according to claim 1, wherein performing the reverberation processing on the second sound signal to generate the digital third sound signal comprises performing the reverberation processing on the digital second sound signal to generate the third sound signal with a reverberation effect.

3. The method according to claim 2, wherein performing the digital sound mixing processing on the digital third sound signal and the background sound signal to generate the digital fourth sound signal comprises performing superposition on the digital third sound signal and the background sound signal to generate the digital fourth sound signal, and wherein the background sound signal is a digital signal.

4. The method according to claim 3, wherein performing the analog sound mixing processing on the second portion of the analog first sound signal and the analog fifth sound signal to generate the analog sixth sound signal comprises performing superposition on the second portion of the analog first sound signal and the analog fifth sound signal to generate the analog sixth sound signal.

5. The method according to claim 3, wherein acquiring the analog first sound signal comprises employing a microphone to acquire the analog first sound signal.

6. The method according to claim 1, wherein the background sound signal is a digital signal.

7. The method according to claim 1, wherein the second portion of the analog first sound signal is sent directly to perform analog sound mixing processing on the second portion of the analog first sound signal and the analog fifth sound signal to generate an analog sixth sound signal.

8. A terminal device, comprising:
- a microphone configured to acquire an analog first sound signal, wherein the analog first sound signal is split into a first portion of the analog first sound signal and a second portion of the analog first sound signal;
- an analog-to-digital converter (ADC) coupled to the microphone and configured to perform analog-to-digital conversion on the analog first sound signal to generate a digital second sound signal;
- a processor coupled to the ADC and configured to:
  - perform reverberation processing on the digital second sound signal to generate a digital third sound signal;
  - perform digital sound mixing processing on the digital third sound signal and a background sound signal sent from an application to generate a digital fourth sound signal;
- a digital-to-analog converter (DAC) coupled to the processor and configured to perform digital-to-analog conversion on the digital fourth sound signal to generate an analog fifth sound signal, wherein the processor is further configured to perform analog sound mixing processing on the second portion of the analog first sound signal and the analog fifth sound signal to generate an analog sixth sound signal; and
- a speaker configured to play the sixth sound signal.

9. The terminal device according to claim 8, wherein the processor is further configured to, perform the reverberation processing on the digital second sound signal to generate the digital third sound signal with a reverberation effect.

10. The terminal device according to claim 9, wherein the processor is further configured to: receive the digital third sound signal sent by the reverberation apparatus; receive the background sound signal sent by the application layer; perform the digital sound mixing processing by performing superposition on the digital third sound signal and the background sound signal to generate the digital fourth sound signal, wherein the background sound signal is a digital signal.

11. The terminal device according to claim 8, wherein the background sound signal is a digital signal.

12. The terminal device according to claim 8, wherein the processor is further configured to perform the analog sound mixing processing by performing superposition on the analog first sound signal and the analog fifth sound signal to generate the sixth sound signal.

13. The terminal device according to claim 8, wherein the microphone is further configured to send the second portion of the analog first sound signal to the processor.

14. The terminal device according to claim 8, wherein the processor comprises one or more codec chips.

15. A method, comprising:
- obtaining an analog first sound signal, wherein the analog first sound signal is split into a first portion of the analog first sound signal and a second portion of the analog first sound signal;
- performing analog-to-digital conversion on the first portion of the analog first sound signal to generate a digital second sound signal;
- performing reverberation processing on the digital second sound signal to generate a digital third sound signal;
- performing digital sound mixing processing on the digital third sound signal and a background sound signal received from an application to generate a digital fourth sound signal;
- performing digital-to-analog conversion on the digital fourth sound signal to generate an analog fifth sound signal; and
- performing analog sound mixing processing on the second portion of the analog first sound signal and the analog fifth sound signal to generate an analog sixth sound signal.

16. The method of claim 15, wherein the second portion of the analog first sound signal is sent directly to perform analog sound mixing processing on the second portion of the analog first sound signal and the analog fifth sound signal to generate an analog sixth sound signal.

17. The method of claim 15, wherein the third sound signal is generated with a reverberation effect.

18. The method of claim 15, wherein the background sound signal is a digital signal.

19. The method of claim 15, wherein performing the digital sound mixing processing on the digital third sound signal and the background sound signal to generate the digital fourth sound signal comprises performing superposition on the digital third sound signal and the background sound signal to generate the digital fourth sound signal.

20. The method of claim 15, wherein the reverberation processing comprises adding a sound effect of a balancer to the digital second sound signal to generate the digital third sound signal.

\* \* \* \* \*